(12) United States Patent
Hwang et al.

(10) Patent No.: US 7,528,039 B2
(45) Date of Patent: May 5, 2009

(54) METHOD OF FABRICATING FLASH MEMORY

(75) Inventors: Hyun-Sang Hwang, Gwangju (KR); Ho-Kyung Park, Gwangju (KR); Man Jang, Gwangju (KR); Min-Seok Jo, Gwangju (KR)

(73) Assignee: Poongsan Microtec Co., Ltd. (KR)

( * ) Notice: Subject to any disclaimer, the term of this patent is extended or adjusted under 35 U.S.C. 154(b) by 0 days.

(21) Appl. No.: 12/021,181

(22) Filed: Jan. 28, 2008

(65) Prior Publication Data

US 2008/0166865 A1 Jul. 10, 2008

(51) Int. Cl.
*H01L 21/336* (2006.01)

(52) U.S. Cl. ............... 438/266; 438/288; 257/314; 257/E21.679

(58) Field of Classification Search ............ 438/266, 438/288, 308, 795; 257/314, E21.679, E21.68
See application file for complete search history.

(56) References Cited

U.S. PATENT DOCUMENTS 7,439,121 B2 * 10/2008 Ohmi et al. ............ 438/211

* cited by examiner

*Primary Examiner*—Quoc D Hoang
(74) *Attorney, Agent, or Firm*—Park & Associates IP Law LLC

(57) ABSTRACT

A method of fabricating a flash memory is provided. The method includes forming a tunneling insulating film, a charge storage film, and a blocking insulating film on a semiconductor substrate; performing High Temperature (HT) anneal for the resultant semiconductor substrate; and performing Low Temperature (LT) wet vapor anneal for the resultant semiconductor substrate.

7 Claims, 6 Drawing Sheets

METHOD OF FABRICATING FLASH MEMORY

FIELD OF THE INVENTION

The present invention relates to a nonvolatile memory, and more particularly, to a method of fabricating a flash memory.

BACKGROUND OF THE INVENTION

Flash memory devices are classified into a NAND type and a NOR type depending on the construction and operation of a cell.

Also, flash memory devices are classified into floating gate series memory devices and Metal-Oxide-Nitride-Oxide-Semiconductor (MONOS) or Semiconductor-Oxide-Nitride-Oxide-Semiconductor (SONOS) memory devices depending on types of materials of a charge storage layer used in a unit cell.

The floating gate series memory devices are devices realizing memory characteristics using potential wells. The MONOS or SONOS series memory devices realize memory characteristics using a trap site within a bulk of a silicon nitride film, which is a dielectric film, or a trap site at an interface between dielectric films. The MONOS series memory device refers to memory devices whose control gates are of metal and the SONOS series memory devices refer to memory devices whose control gates are of polycrystalline silicon.

In particular, the SONOS or MONOS type flash memories have an advantage of relatively easy scaling, improved endurance, and regular threshold-voltage distribution compared to the floating gate type flash memories. However, the SONOS or MONOS type flash memories induce a degradation of characteristics of retention and endurance when a tunneling insulating film and a blocking insulating film are made thin in thickness for high integration.

As a solution to this drawback, it has been proposed that existing silicon oxide be substituted with high-k oxide as a blocking insulating film. However, traps generated at the time of depositing the high-k oxide for the blocking insulating film cause back tunneling of electrons through an electrode in an erase mode condition of high voltage. That is, there is a drawback that charges pass through the blocking insulating film from a control gate and remain in a bulk or an interface of a charge storage layer when a control voltage is applied to a control gate and Fowler-Nordheim (F-N) Tunneling is performed to move electrons from a nitride film that is a charge storage layer to a channel. Accordingly, the back tunneling deteriorates the characteristics of operation of flash memories to store information by a variation of a threshold voltage.

As a solution to the above drawback, the conventional art processes a blocking insulating film deposited by high temperature Rapid Thermal Anneal (RTA) of 800° C. or more to optimize the characteristics of the blocking insulating film. However, despite this solution, there still remains a limit in improving the characteristics of the blocking oxide film.

SUMMARY OF THE INVENTION

An aspect of exemplary embodiments of the present invention is to address at least the problems and/or disadvantages and to provide at least the advantages described below. Accordingly, an aspect of exemplary embodiments of the present invention is to provide a method of fabricating a flash memory, for improving charge blocking efficiency by removing trap sites from a blocking insulating film using High Pressure (HP) wet vapor anneal.

According to one aspect of the present invention, there is provided a method of fabricating a flash memory. The method includes forming a tunneling insulating film on a semiconductor substrate; forming a charge storage film on the tunneling insulating film; forming a blocking insulating film on the charge storage film; performing High Temperature (HT) anneal for the semiconductor substrate comprising the blocking insulating film; and performing Low Temperature (LT) wet vapor anneal for the semiconductor substrate for which the HT anneal is performed. The LT wet vapor anneal is performed under an atmosphere of 2 to 100 atmospheric pressure, cures oxygen defects of the blocking insulating film, and uses vapor to cure interfacial defects.

BRIEF DESCRIPTION OF THE DRAWINGS

The above and other objects, features and advantages of the present invention will become more apparent from the following detailed description when taken in conjunction with the accompanying drawings in which.

Throughout the drawings, the same drawing reference numerals will be understood to refer to the same elements, features and structures.

DETAILED DESCRIPTION OF THE INVENTION

Exemplary embodiments of the present invention will now be described in detail with reference to the annexed drawings. In the following description, a detailed description of known functions and configurations incorporated herein has been omitted for conciseness.

FIGS. 1A to 1E are cross sections illustrating a method of fabricating a flash memory according to an exemplary embodiment of the present invention.

Figure 1A:
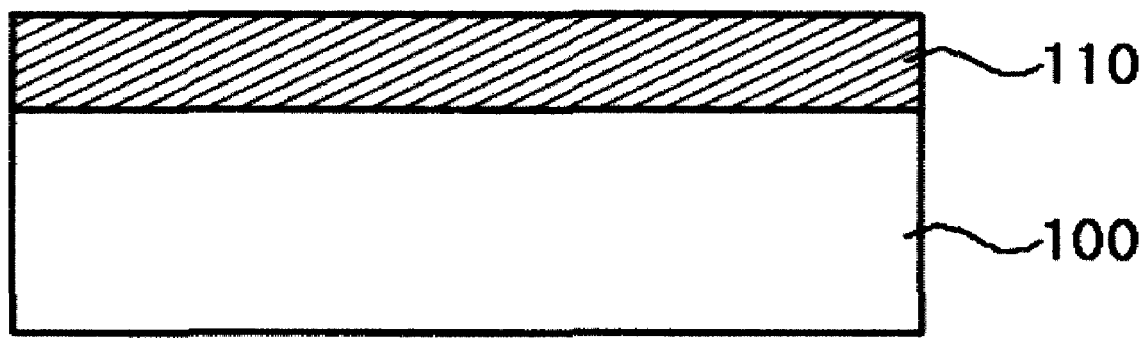
FIGS. 1A to 1E are cross sections illustrating a method of fabricating a flash memory according to an exemplary embodiment of the present invention.

Referring to FIG. 1A, a tunneling insulating film 110 is formed on a semiconductor substrate 100. Desirably, the tunneling insulating film 110 is of silicon oxide. The tunneling insulating film 110 is controlled in its thickness so that charges can easily get out of the tunneling insulating film 110 to a channel region by F-N tunneling in an erase mode and charges can be easily introduced into a charge storage layer in a program mode. Thus, it is desirable that the tunneling insulating film 110 is formed at a thickness of 5 nm or less.

Figure 1B:
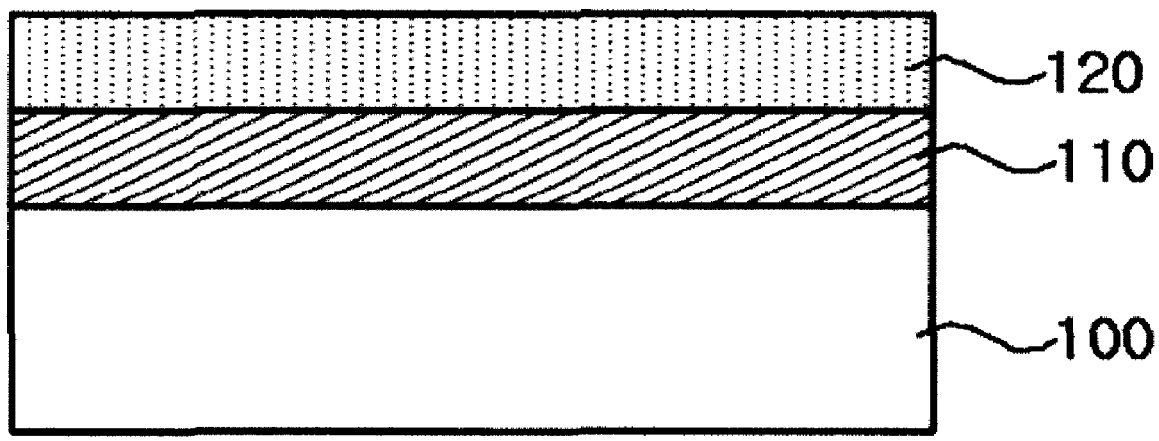

Referring to FIG. 1B, a charge storage film 120 is formed on the tunneling insulating film 110 formed on the semiconductor substrate 100. The charge storage film 120 stores electrons that pass through the tunneling insulating film 110 from the channel region of the semiconductor substrate 100. The charge storage film 120 is desirably formed of silicon nitride.

Figure 1C:
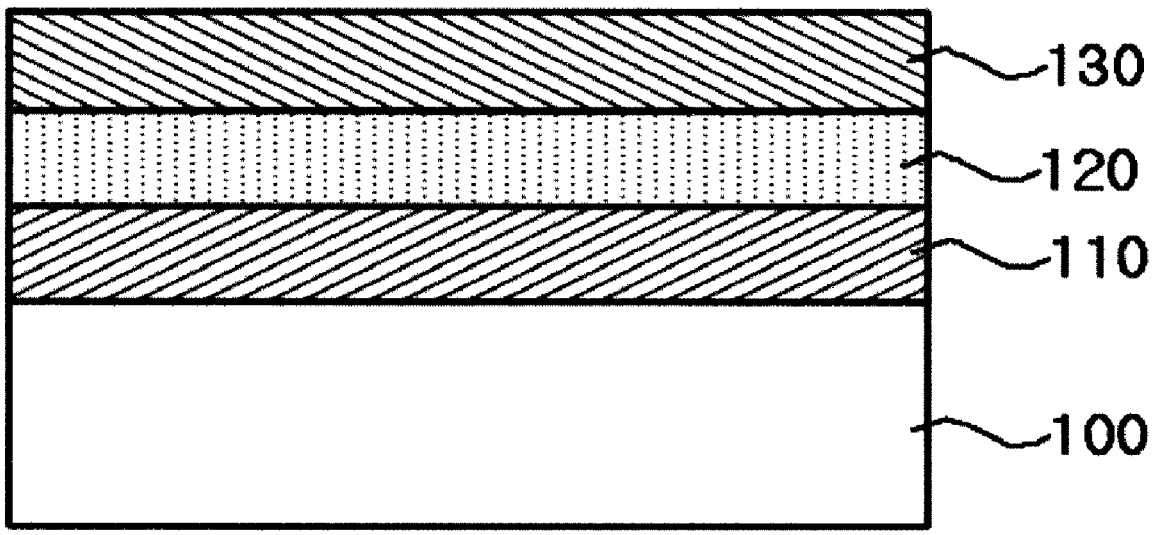

Referring continuously to FIG. 1C, a blocking insulating film 130 is formed on the charge storage layer 120. In a program mode, the blocking insulating film 130 prevents electrons passing through the tunneling insulating film 110 from getting out of the charge storage layer 120 toward a control gate. In an erase mode, the blocking insulating film 130 prevents electrons from flowing into the charge storage film 120 from the control gate. For this, the blocking insulating film 130 desirably is of high-k dielectric materials having a high dielectric constant. For example, the blocking insulating film 130 desirably is of materials including high-k dielectric materials such as $Al_2O_3$, $HfO_2$, $ZrO_2$, $Ta_2O_5$, $TiO_2$, $YO_2$, etc. More desirably, the blocking insulating film 130 is of hafnium (Hf) silicate, zirconium (Zr) silicate, yttrium (Y) silicate, or lanthanide (Ln) series metal silicate.

Next, High Temperature (HT) anneal is performed for the semiconductor substrate 100 including the blocking insulating film 130.

In other words, the HT anneal is performed at about 800° C. or more. For rapid rise to a target temperature, Rapid Thermal Process (RTP) is used. In other words, the temperature rather rises for a short time within the limits of an anneal equipment than the temperature slowly rises for more time. An anneal process is performed for at least one minute after the temperature reaches the target temperature. Owing to the execution of the HT anneal, defects in the blocking insulating film 130 are cured.

The defects in the blocking insulating film 130 can be classified into point defects, line defects, or plane defects. Basically, high temperature curing is a process of increasing energy of particles, moving the high temperature particles to energy concentrated defects, and curing the defects. However, the high temperature curing has a limitation in completely curing the blocking insulating film 130 having oxygen. In other words, it is difficult to cure mismatching of particles caused by the lack of oxygen concentration or oxygen vacancies caused by the lack of oxygen. Undoubtedly, there is a limitation in curing the line defects or plane defects as well.

Accordingly, after the HT anneal, a Low Temperature (LT) anneal is performed. The LT anneal is performed under a high pressure atmosphere at about 200° C. to 600° C. When the LT anneal is performed, vapor is supplied to an atmosphere of inertia gas such as nitrogen (N) and argon (Ar). Desirably, the LT anneal is performed for about 10 minutes at about 250° C. under an atmosphere including nitrogen of about 10 atmospheric pressure and vapor of about 2 atmospheric pressure. Because the LT anneal is performed under the high pressure atmosphere, oxygen included in vapor is penetrated into the blocking insulating film 130 and cures remnant defects in the blocking insulating film 130. Also, a gas pressure at the time the LT anneal is performed can be about 2 to 100 atmospheric pressure.

Figure 1D:
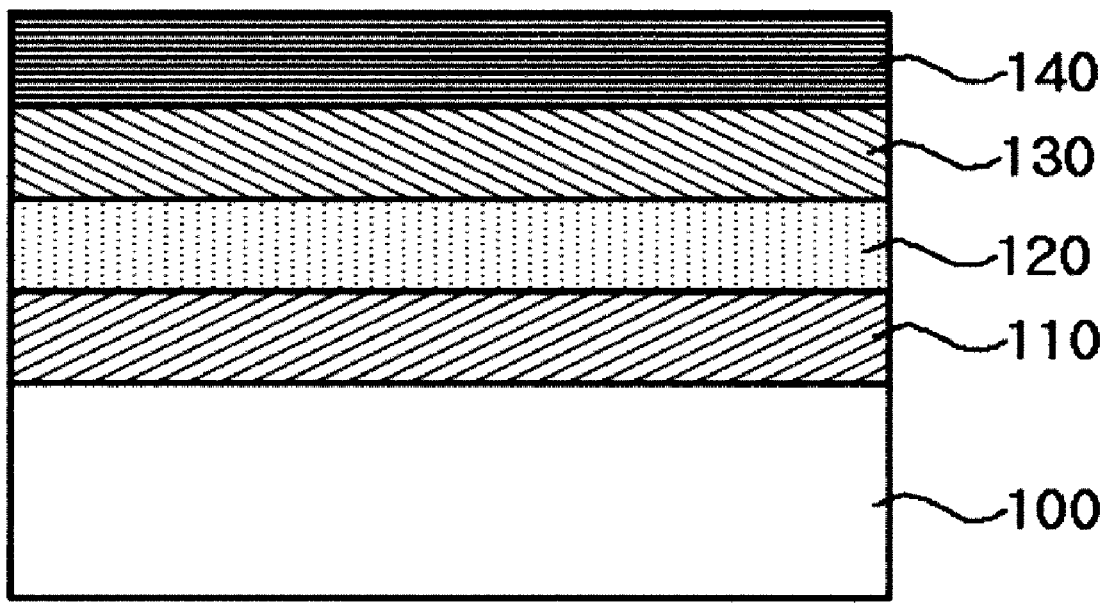

Referring to FIG. 1D, a control gate film 140 is formed on the blocking insulating film 130 formed over the semiconductor substrate 100 for which the HT anneal and the LT anneal are performed. Desirably, the control gate film 140 is of titanium (Ti), tantalum (Ta), tantalum nitride (TaN), titanium nitride (TiN), or polycrystalline silicon.

Figure 1E:
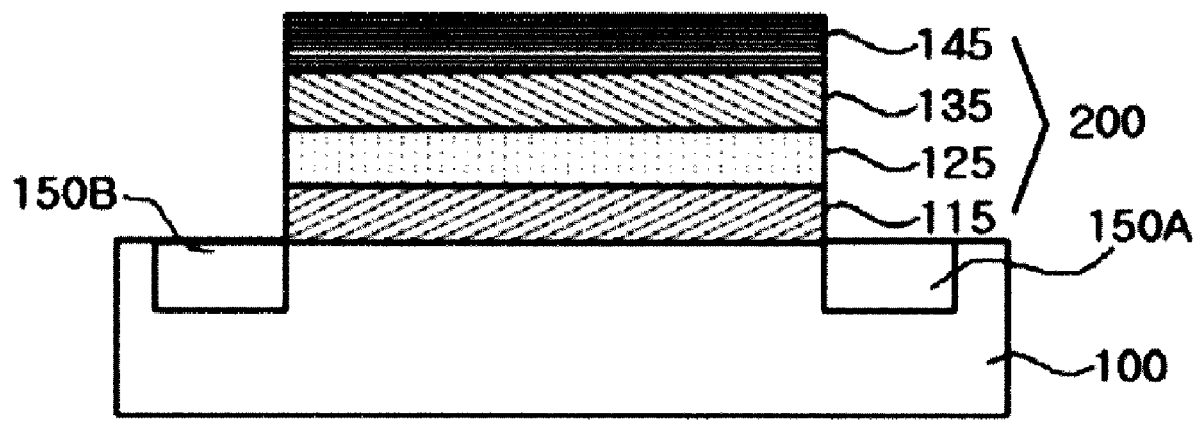

Referring continuously to FIG. 1E, a gate etching mask (not shown) is formed on the control gate film 140 using a general photolithography process. For example, the etching mask desirably is of nitride when the control gate film 140 is of polycrystalline silicon.

Next, the semiconductor substrate 100 including the etching mask is anisotropically etched, thereby forming a gate pattern 200. Accordingly, the gate pattern 200 is comprised of a tunneling insulating layer 115, a charge storage layer 125, a blocking insulating layer 135, and a control gate layer 145. Sidewall spacers (not shown) of nitride can be provided at side surfaces of the gate pattern 200.

Ion implantation is performed at both sides of the gate pattern 200, thereby forming source/drain regions 150A and 150B.

Figure 2:
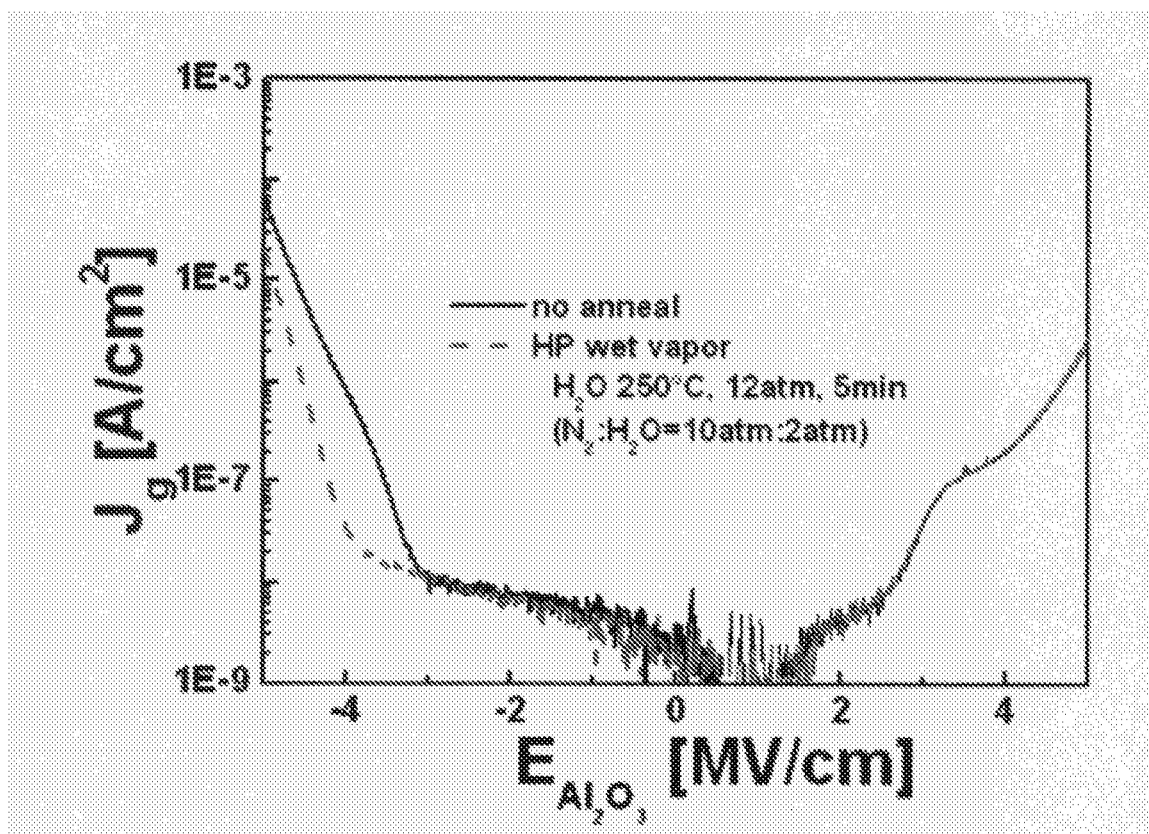
FIG. 2 is a graph showing a measurement of a gate leakage current of a flash memory fabricated according to an exemplary embodiment of the present invention.

FIG. 2 is a graph illustrating a measurement of a gate leakage current of a flash memory fabricated according to an exemplary embodiment of the present invention.

Referring to FIG. 2, a Y axis represents a gate leakage current and an X axis represents an electric field applied to the blocking insulating layer in case where a tunneling insulating layer is of silicon oxide ($SiO_2$), a charge storage layer is of silicon nitride ($Si_3N_4$), and the blocking insulating layer is of aluminum oxide ($Al_2O_3$), respectively.

It can be appreciated that LT wet vapor anneal removes defects or oxygen vacancies from the blocking insulating layer, reducing a leakage current in an erase mode. That is, in the erase mode, a negative electric field is applied through the blocking insulating material and though the negative electric field increases, a gate leakage current greatly decreases compared to a case with no LT wet vapor anneal.

In a program mode, a positive electric field is applied through the blocking insulating layer, and the tunneling insulating layer has influence on leakage current characteristics. Accordingly, it can be appreciated that the leakage current characteristics not influenced by the LT wet vapor anneal are shown in the program mode.

Figure 3:
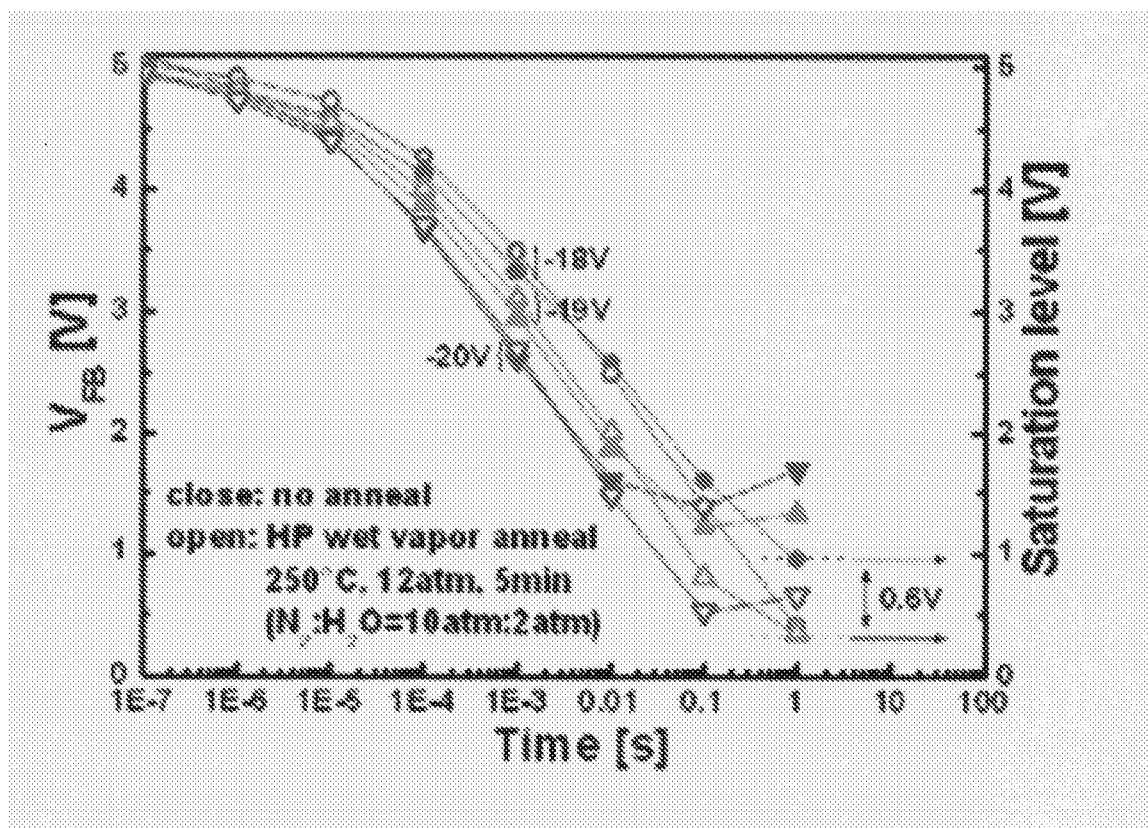
FIG. 3 is a graph showing a speed of an erase operation of a flash memory according to an exemplary embodiment of the present invention.

FIG. 3 is a graph showing a speed of an erase operation of a flash memory according to an exemplary embodiment of the present invention.

Referring to FIG. 3, a Y axis represents a flat band voltage ($V_{FB}$) and an X axis represents time. The $V_{FB}$ refers to a voltage applied to flat an energy band shifted by charges existing in elements constituting the gate pattern. The $V_{FB}$ is closely associated with an amount of electrons existing in the charge storage layer storing charges. Also, the $V_{FB}$ decreases as erase time increases. This is because electrons in the charge storage layer are erased through the tunneling insulating layer. Meantime, in cases where a high negative voltage is applied to the control gate, electrons get out of the charge storage layer through the tunneling insulating layer; however, erase operation is not performed completely because of electrons passing through the blocking insulating layer from the control gate layer and introduced into the charge storage layer. Accordingly, the $V_{FB}$ tends to rise.

In FIG. 3, if a high negative voltage is applied with no anneal, an amount of electrons introduced into the blocking insulating layer from the control gate layer increases because of factors of leakage current in the blocking insulating layer. Accordingly, the $V_{FB}$ rises.

However, LT wet vapor anneal can remove the leakage current factors and reduce the amount of electrons introduced into the blocking insulating layer, making erase operation smooth.

Figure 4:
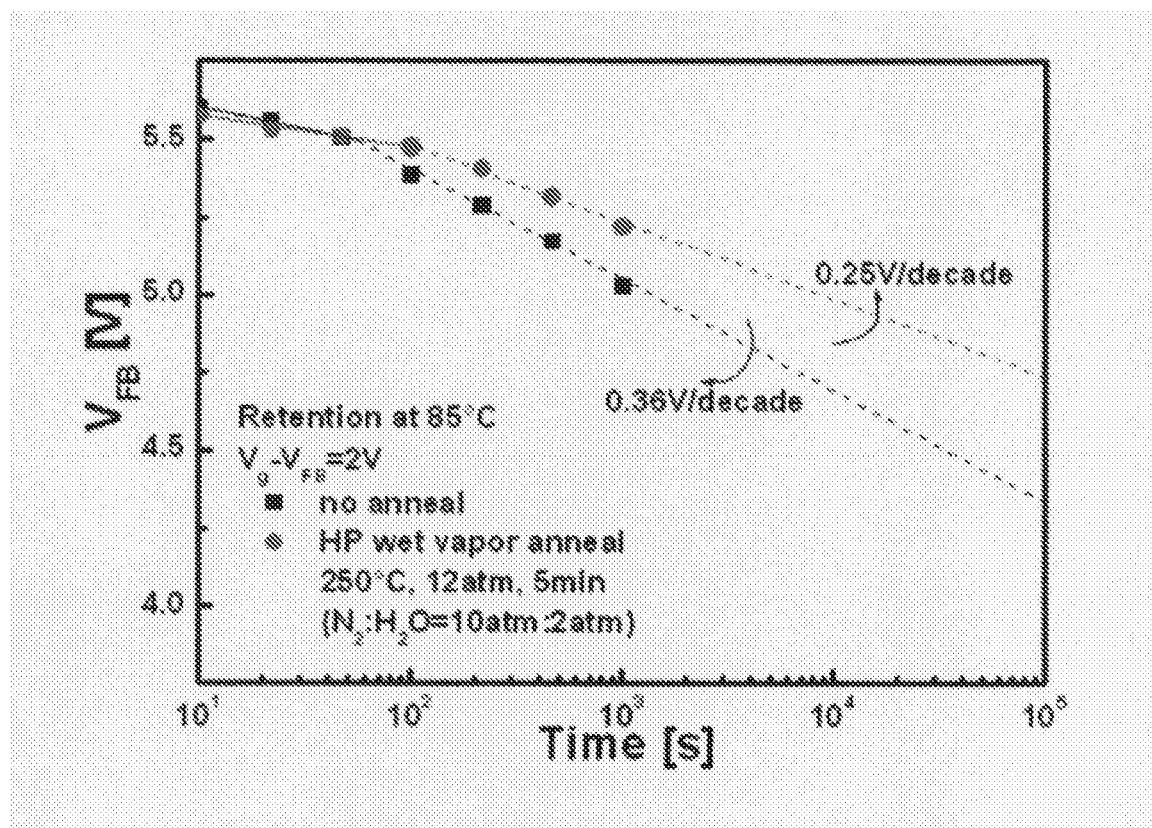
FIG. 4 is a graph showing an analysis result of the retention characteristic of a flash memory according to an exemplary embodiment of the present invention.

FIG. 4 is a graph showing an analysis result of the retention characteristics of a flash memory according to an exemplary embodiment of the present invention.

Referring to FIG. 4, a Y axis represents a $V_{FB}$ and an X axis represents time. Retention is to evaluate how much amount of electrons stored in a flash memory is lost at a specific temperature. Thus, the $V_{FB}$ is closely associated with the number of electrons in the charge storage layer. It was checked that how much $V_{FB}$ reduces according to time with the same $V_{FB}$ (5.8 volts) set for the same evaluation in the presence or absence of LT wet vapor anneal.

In general, electrons in the charge storage layer acquire energy when heated and shift to a conduction band. Here, a direction in which electrons are lost directs generally to the tunneling insulating layer. In FIG. 4 however, a direction in which electrons are lost was made to direct to the blocking insulating layer by applying a positive gate voltage (Vg) deliberately.

In FIG. 4, it can be appreciated that the LT wet vapor anneal prevents a loss of charges through the blocking insulating layer and greatly reduces a loss speed of charges compared to a case with no anneal.

As described above, general HT anneal generates additional oxidation while causing a variation of a thickness of a thin film at an interface between silicon and an insulating film. This affects interfacial properties. Thus, additional interface oxidation should be prevented even after the HT anneal is performed. In this respect, there is an effect that HP wet vapor anneal is performed at low temperature, suppressing additional oxidation.

Further, in the case of LT wet vapor anneal, hydrogen and oxygen are concurrently supplied from thermally activated vapor, removing defects from an insulating film. That is, oxygen removes oxygen vacancies from the insulating film and hydrogen penetrates deeper into the insulating film owing to its small atomic size and additionally reacts with silicon (Si) dangling bond at an interface, thereby improving interfacial properties.

According to the present invention, after HT anneal, LT wet vapor anneal is performed, thereby removing defects from a blocking insulating film. By defects removal, backing tunneling generated in an erase mode of a flash memory can be prevented and efficient erase operation can be performed. Accordingly, electrical properties of the flash memory are improved.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method of fabricating a flash memory, comprising:
   forming a tunneling insulating film on a semiconductor substrate;
   forming a charge storage film on the tunneling insulating film;
   forming a blocking insulating film on the charge storage film;
   performing High Temperature (HT) anneal for the semiconductor substrate comprising the blocking insulating film; and
   performing Low Temperature (LT) wet vapor anneal for the semiconductor substrate for which the HT anneal is performed,
   wherein the LT wet vapor anneal is performed under an atmosphere of 2 to 100 atmospheric pressure, cures oxygen defects of the blocking insulating film, and uses vapor to cure interfacial defects.

2. The method of claim 1, wherein the LT wet vapor anneal is performed at a temperature of 200° C. to 600° C.

3. The method of claim 2, wherein the LT wet vapor anneal supplies vapor to an atmosphere of inertia gas of nitrogen (N) or argon (Ar).

4. The method of claim 3, wherein the LT wet vapor anneal is performed at a temperature of 250° C. under an atmosphere comprising nitrogen of 10 atmospheric pressure and vapor of 2 atmospheric pressure.

5. The method of claim 1, wherein the blocking insulating film is of materials comprising $Al_2O_3$, $HfO_2$, $ZrO_2$, $Ta_2O_5$, $TiO_2$, or $YO_2$ as high-k dielectric materials having a high dielectric constant or is of hafnium (Hf) silicate, zirconium (Zr) silicate, yttrium (Y) silicate, or lanthanide (Ln) series metal silicate.

6. The method of claim 1, further comprising: after the LT wet vapor anneal,
   forming a control gate film on the blocking insulating film; and
   forming an etching mask on the control gate film and forming a gate pattern by etching.

7. The method of claim 6, wherein the control gate film is of titanium (Ti), tantalum (Ta), tantalum nitride (TaN), titanium nitride (TiN), or polycrystalline silicon.

* * * * *